(12) United States Patent
Ishida

(10) Patent No.: US 9,484,213 B2
(45) Date of Patent: Nov. 1, 2016

(54) PROCESSING GAS DIFFUSING AND SUPPLYING UNIT AND SUBSTRATE PROCESSING APPARATUS

(71) Applicant: TOKYO ELECTRON LIMITED, Minato-ku (JP)

(72) Inventor: Toshifumi Ishida, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 569 days.

(21) Appl. No.: 13/838,468

(22) Filed: Mar. 15, 2013

(65) Prior Publication Data
US 2013/0199729 A1    Aug. 8, 2013

Related U.S. Application Data

(63) Continuation-in-part of application No. 12/399,396, filed on Mar. 6, 2009, now Pat. No. 9,177,839.

(60) Provisional application No. 61/050,668, filed on May 6, 2008.

(30) Foreign Application Priority Data

Mar. 6, 2008    (JP) ................................ 2008-056432

(51) Int. Cl.
*C23C 16/00* (2006.01)
*C23F 1/00* (2006.01)
(Continued)

(52) U.S. Cl.
CPC ....... *H01L 21/3065* (2013.01); *H01J 37/3244* (2013.01); *H01J 37/3266* (2013.01); *H01J 37/32091* (2013.01)

(58) Field of Classification Search
USPC ....................... 118/715; 156/345.33, 345.34
See application file for complete search history.

(56) References Cited

U.S. PATENT DOCUMENTS

| 4,825,809 A | 5/1989 | Mieno |
| 5,105,761 A | 4/1992 | Charlet et al. |

(Continued)

FOREIGN PATENT DOCUMENTS

| JP | 4-37126 A | 2/1992 |
| JP | 8-153679 A | 6/1996 |

(Continued)

OTHER PUBLICATIONS

Office Action mailed Sep. 13, 2013 in co-pending U.S. Appl. No. 12/399,396.

(Continued)

*Primary Examiner* — Rakesh Dhingra
(74) *Attorney, Agent, or Firm* — Oblon, McClelland, Maier & Neustadt, L.L.P.

(57) ABSTRACT

A processing gas diffusing and supplying unit is provided in a substrate processing unit including a processing chamber for accommodating a substrate. The processing gas diffusing and supplying unit comprises a main body; a plate supported by the main body and having a plurality of gas supply holes; a partition wall; an internal space having a first and a second space partitioned by the partition wall; a first and a second opening respectively communicating with the first and the second space while facing the plate, first and a second space being connected to a first and a second processing gas introducing pipe of the processing chamber, respectively; and a first and a second shielding portion respectively installed in the first and the second space and having a surface facing the first and the second opening.

20 Claims, 10 Drawing Sheets

(51) Int. Cl.
*H01L 21/306* (2006.01)
*H01L 21/3065* (2006.01)
*H01J 37/32* (2006.01)

(56) References Cited

U.S. PATENT DOCUMENTS

| | | | |
|---|---|---|---|
| 6,444,039 B1* | 9/2002 | Nguyen | 118/715 |
| 2002/0059904 A1* | 5/2002 | Doppelhammer | C23C 16/45574 118/715 |
| 2004/0118345 A1 | 6/2004 | White et al. | |
| 2004/0129217 A1 | 7/2004 | Strang | |
| 2005/0014382 A1* | 1/2005 | Lee et al. | 438/706 |
| 2006/0054280 A1 | 3/2006 | Jang | |
| 2006/0060138 A1 | 3/2006 | Keller et al. | |
| 2006/0086319 A1 | 4/2006 | Kasai et al. | |
| 2007/0051471 A1 | 3/2007 | Kawaguchi et al. | |
| 2007/0181181 A1* | 8/2007 | Mizusawa | 137/1 |
| 2007/0235136 A1 | 10/2007 | Enomoto et al. | |
| 2008/0078746 A1* | 4/2008 | Masuda | 216/79 |
| 2009/0159002 A1* | 6/2009 | Bera et al. | 118/715 |

FOREIGN PATENT DOCUMENTS

| | | |
|---|---|---|
| JP | 11-54440 | 2/1999 |
| JP | WO 2004/111297 | 12/2004 |

OTHER PUBLICATIONS

Office Action issued Dec. 8, 2010 in Korean Application No. 10-2009-0018600 (With English Translation).
Japanese Office Action issued Nov. 13, 2012 in Patent Application No. 2008-056432.
Office Action mailed Mar. 21, 2014 in co-pending U.S. Appl. No. 12/399,396.
Office Action issued Apr. 1, 2014, in Japanese Patent Application No. 2013-056280.

* cited by examiner

PROCESSING GAS DIFFUSING AND SUPPLYING UNIT AND SUBSTRATE PROCESSING APPARATUS

CROSS-REFERENCE TO RELATED APPLICATIONS

This application is continuation-in-part application of U.S. application Ser. No. 12/399,396, filed on Mar. 6, 2009, which claims priority to Japanese Patent Application No. 2008-056432, filed on Mar. 6, 2008 and U.S. provisional application Ser. No. 61/050,668, filed on May 6, 2008.

FIELD OF THE INVENTION

The present invention relates to a processing gas diffusing and supplying unit and a substrate processing apparatus; and, more particularly, to a shielding portion and a partition wall of a processing gas diffusing and supplying unit of a substrate processing apparatus for performing plasma processing on a substrate.

BACKGROUND OF THE INVENTION

A substrate processing apparatus typically includes a processing chamber that accommodates a wafer for a semiconductor device (hereinafter simply referred to as "wafer") as a substrate, and a shower head provided in an upper portion of the processing chamber. In such a substrate processing apparatus, a processing gas is supplied into a processing space within the processing chamber through a plurality of gas holes of the shower head, and the wafer is subjected to plasma processing by means of plasma generated from the processing gas in the processing space.

FIG. 7 is a schematic sectional view showing a structure of a shower head included in a conventional substrate apparatus.

A shower head 70 includes a ceiling electrode plate 71 made of a conductive material, an electrode plate holder 72 for holding the ceiling electrode plate 71, and an internal space 73 provided within the electrode plate holder 72. One end of a gas introducing pipe 74 through which a processing gas is introduced into the internal space 73 is connected to the internal space 73. In addition, a plurality of gas supplying holes 75 and 76 which penetrates through the ceiling electrode plate 71 to allow the internal space 73 to communicate with a processing chamber (not shown) is formed in the ceiling electrode plate 71. In the shower head 70, the processing gas introduced into the internal space 73 through the gas introducing pipe 74 is supplied into a processing space through the gas holes 75 and 76.

However, in such a shower head 70, since the processing gas in the internal space 73 is injected from the gas introducing pipe 74 in the downward direction of the figure, the amount of processing gas passing through the gas hole 75 located immediately below the gas introducing pipe 74 is relatively large while the amount of processing gas passing through the gas holes 76 is relatively small. In this case, since the processing gas cannot be uniformly supplied through the gas holes 75 and 76 into the processing space, plasma generated from the processing gas cannot be uniformly distributed on a wafer. On this account, a surface of the wafer may not be subjected to uniform plasma processing, and as a result, it becomes difficult to secure in-plane uniformity of the plasma processing.

In this connection, there has been proposed a substrate processing apparatus provided with a shower head having buffer plates arranged within its internal space (see, e.g., Japanese Patent Laid-open Publication No. H-11-054440). In such a shower head, the buffer plate 77 is disposed to face an opening of the gas introducing pipe 74 in the internal space 73 (see FIG. 8). The buffer plate serves to diffuse the processing gas injected from the gas introducing pipe 74 in the internal space 73 in a horizontal direction of the figure while preventing the processing gas from directly flowing through the gas hole 75. This prevents the amount of processing gas passing through the gas hole 75 from extremely increasing and allows the processing gas to be uniformly supplied through the gas holes 75 and 76 into the processing space.

However, there is a case where the thickness (in the vertical direction of the figure) of the shower head 70 is limited and the height of the internal space 73 cannot be sufficiently secured. In this case, the buffer plate 77 is disposed within the internal space 73 and the internal space 73 is divided into an upper space and a lower space. However, the height of both of the upper and lower spaces is extremely lowered, it becomes difficult to increase a conductance with regard to a horizontal flow (diffusion) of the processing gas. As a result, since the processing gas in the internal space 73 cannot be sufficiently diffused in the horizontal direction, the processing gas cannot be uniformly supplied into the processing space, thereby still making it difficult to secure in-plane uniformity of plasma processing for the wafer.

SUMMARY OF THE INVENTION

The present invention provides a processing gas diffusing and supplying unit and a substrate processing apparatus which are capable of securing in-plane uniformity of plasma processing and the like for a substrate.

In accordance with an aspect of the present invention, there is provided a processing gas diffusing and supplying unit in a substrate processing unit including a processing chamber for accommodating a substrate and a first and a second processing gas introducing pipe, for supplying a processing gas into the processing chamber. The processing gas diffusing and supplying unit comprises a main body; a plate supported by the main body, the plate having a plurality of gas supply holes for supplying the processing gas into the processing chamber; a partition wall; an internal space formed in the main body, the internal space having a first and a second space partitioned by the partition wall and the processing gas being supplied through the first and the second processing gas introducing pipe to the internal space; a first opening communicating with the first space while facing the plate, the first opening being connected to the first processing gas introducing pipe; a second opening communicating with the second space while facing the plate, the second opening being connected to the second processing gas introducing pipe; a first shielding portion installed in the first space, the first shielding portion having a surface opposite to the first opening; and a second shielding portion installed in the second space, the second shielding portion having a surface opposite to the second opening, wherein a height of the internal space is equal to or greater than 8 mm so that the processing gas discharged from the first and the second opening is diffused to the first and the second space and is uniformly supplied through the gas supply holes.

Preferably, the first opening may be disposed at a location closer to a center of the processing gas diffusing and supplying unit compared to the second opening.

Preferably, the first opening and the second opening may be disposed at locations separated from a center of the processing gas diffusing and supplying unit; and the surface opposite to the first opening and the surface opposite to the second opening may be in parallel with a surface of the substrate accommodated in the processing chamber.

Preferably, the partition wall may have a substantially cylindrical shape.

Preferably, the partition wall may be disposed between the gas supply holes so as not to block the gas supply holes.

Preferably, the first shielding portion and the second shielding portion may be formed as one unit with the partition wall.

Preferably, the substrate processing apparatus may further include a third processing gas introducing pipe, and the processing gas diffusing and supplying unit may further comprise another partition wall configured to define a third space by partitioning the internal space; a third opening communicating with the third space while facing the plate, the third opening being connected to the third processing gas introducing pipe; and a third shielding portion installed in the third space, the third shielding portion having a surface facing the third opening.

Preferably, the substrate processing apparatus may further include a fourth processing gas introducing pipe, and the processing gas diffusing and supplying unit may further comprise still another partition wall configured to define a fourth space by partitioning the internal space; a fourth opening communicating with the fourth space while facing the plate, the fourth opening being connected to the fourth processing gas introducing pipe; and a fourth shielding portion installed in the fourth space, the fourth shielding portion having a surface facing the fourth opening.

In accordance with another aspect of the present invention, there is provided a substrate processing apparatus comprising a processing chamber configured to accommodate a substrate; a processing gas diffusing and supplying unit configured to supply a processing gas into the processing chamber; and a first and a second processing gas introducing pipe configured to introduce the processing gas into the processing gas diffusing and supplying unit. The processing gas diffusing and supplying unit includes a main body; a plate supported by the main body, the plate having a plurality of gas supply holes for supplying the processing gas into the processing chamber; a partition wall; an internal space formed in the main body, the internal space having a first and a second space partitioned by the partition wall and the processing gas being supplied through the first and the second processing gas introducing pipe to the internal space; a first opening communicating with the first space while facing the plate, the first opening being connected to the first processing gas introducing pipe; a second opening communicating with the second space while facing the plate, the second opening being connected to the second processing gas introducing pipe; a first shielding portion installed in the first space, the first shielding portion having a surface opposite to the first opening; and a second shielding portion installed in the second space, the second shielding portion having a surface opposite to the second opening. A height of the internal space is equal to or greater than 8 mm so that the processing gas discharged from the first and the second opening is diffused to the first and the second space and is uniformly supplied through the gas supply holes/

Preferably, a flow of the processing gas introduced into the processing gas diffusing and supplying unit through the first processing gas introducing pipe and a flow of the processing gas introduced into the processing gas diffusing and supplying unit through the second processing gas line may be individually controlled.

Preferably, the apparatus may further comprise an additional gas supply source connected to at least one of the first to the third processing gas introducing pipe via an additional gas supply pipe.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, exemplary embodiments of the present invention will be described with reference to the accompanying drawings which form a part hereof.

Figure 1:
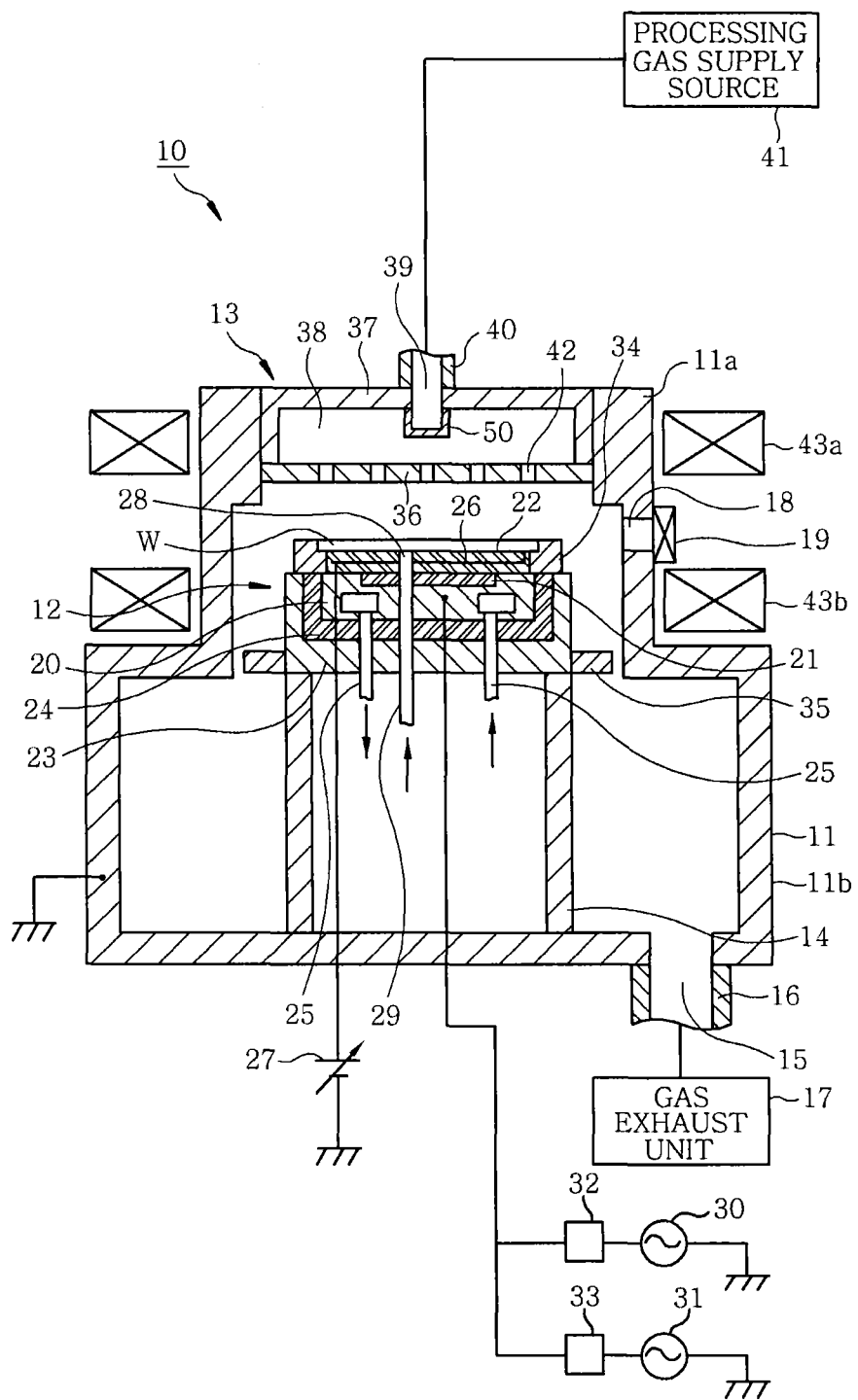
FIG. 1 is a schematic sectional view showing a configuration of a plasma processing apparatus provided with a cover part according to an embodiment of the present invention.

FIG. 1 is a schematic sectional view showing a configuration of a plasma processing apparatus provided with a cover part in accordance with an embodiment of the present invention. The shown plasma processing apparatus is configured to subject a semiconductor wafer (substrate) having a diameter of, e.g., 300 mm to plasma etching, for example, reactive ion etching (RIE), or ashing.

In FIG. 1, the plasma processing apparatus 10 (substrate processing apparatus) includes, for example, a processing chamber 11 such as a vacuum chamber, a mounting table 12 arranged in a central portion of the bottom of the processing chamber 11, and a shower head 13 (processing gas diffusing and supplying unit) arranged to face the mounting table 12 above the mounting table 12.

The processing chamber 11 includes a smaller diameter cylindrical upper chamber 11a and a larger diameter cylindrical lower chamber 11b. The upper chamber 11a and the lower chamber 11b communicate with each other and the processing chamber 11 is made airtight as a whole. The mounting table 12 or the shower head 13 is accommodated in the upper chamber 11a and a support case 14 which supports the mounting table 12 and accommodating a pipe for coolant or back side gas is received in the lower chamber 11b.

A gas exhaust port 15 is provided in the bottom side of the lower chamber 11b and a gas exhaust unit 17 is connected to the gas exhaust port 15 via a gas exhaust pipe 16. The gas exhaust unit 17 includes an adaptive pressure control (APC) valve and a dry pump (DP) or a turbo molecular pump (TMP) (all not shown), which are controlled by a signal from a controller (not shown) to keep the inside of the processing chamber 11 at a desired degree of vacuum by performing vacuum exhaust. Meanwhile, a loading/unloading port 18 for a wafer W is provided in a side of the upper chamber 11a and can be opened/closed by means of a gate valve 19. The upper chamber 11a and the lower chamber 11b are made of conductive material such as aluminum or the like and are grounded.

The mounting table 12 includes a lower electrode 20 for plasma generation, which is a table-like upper member made of, for example, conductive material such as aluminum, a dielectric layer 21 made of dielectric material such as ceramic, which is buried in an upper central portion of the lower electrode 20 to make intensity of an electric field uniform in a processing space which will be described later, and an electrostatic chuck 22 for electrostatically attracting and holding the wafer W on a mounting surface. In the mounting table 12, the lower electrode 20, the dielectric layer 21 and the electrostatic chuck 22 are laminated in that order. In addition, the lower electrode 20 is fixed to a support 23 installed on the support case 14 through an insulating member 24 and remains electrically floated sufficiently with respect to the processing chamber 11.

A coolant path 25 through which the coolant flows is formed in the lower electrode 20. With the coolant flowing through the coolant path 25, the lower electrode 20 is cooled and the wafer W mounted on the mounting surface on the electrostatic chuck 22 is accordingly cooled to a desired temperature.

The electrostatic chuck 22 is made of dielectric material and contains a conductive electrode film 26. The electrode film 26 is made of, e.g., electrode material which is a mixture of alumina ($Al_2O_3$) and molybdenum carbide (MoC). A high voltage DC power supply 27 is connected to the electrode film 26 and high voltage DC power supplied to the electrode film 26 produces a Coulomb force between the mounting surface of the electrostatic chuck 22 and the wafer W, thereby electrostatically attracting and holding the wafer W on the mounting surface.

In addition, a through hole 28 through which a backside gas for increasing thermal conductivity between the mounting surface and the backside of the wafer W is ejected is formed in the electrostatic chuck 22. The through hole 28 communicates with a gas path 29 formed in the lower electrode 20 and the like and the back side gas such as helium (He) supplied from a gas supplying unit (not shown) is ejected through the gas path 29 and the through hole 28.

The lower electrode 20 is connected with a first radio frequency (RF) power supply 30 for supplying RF power having a frequency of 100 MHz and a second RF power supply 31 for supplying RF power of, example, a frequency of 3.2 MHz, which is lower than the frequency of the first RF power supply 30, via their respective matching unit 32 and 33. The RF power supplied from the first RF power supply 30 generates plasma from the processing gas and the RF power supplied from the second RF power supply 31 applies a bias voltage to the wafer W, thereby attracting ions in the plasma to the surface of the wafer W.

In addition, a focus ring 34 surrounding the electrostatic chuck 22 is arranged on the outer peripheral portion of the top side of the lower electrode 20. The focus ring 34 widens a contacting area of the plasma beyond a space facing the wafer W in the process space which will be described later, thereby improving uniformity of an etching rate in the plane of the wafer W.

A baffle plate 35 surrounding the support 23 is arranged in the lower outer side of the support 23. The baffle plate 35 serves as a rectifying plate for regulating a flow of the processing gas by allowing the processing gas in the upper chamber 11a to flow into the lower chamber 11b through a gap formed between the baffle plate 35 and a wall portion of the upper chamber 11a and prevents the plasma in the process space, which will be described later, from being leaked into the lower chamber 11b.

The shower head 13 serving as an upper electrode includes a ceiling electrode plate 36 which faces the upper chamber 11a and is made of conductive material, an electrode plate holder 37 (wall portion) for holding the ceiling electrode plate, an internal space 38 provided within the electrode plate support 37, and a cover part 50 which will be described later. The internal space 38 extends in parallel to the surface of the wafer W which is accommodated in the processing chamber 11 and mounted on the mounting table 12. One end of a processing gas introducing pipe 40 is connected to the internal space 38 via an opening 39 and the other end thereof is connected to a processing gas supply source 41. The processing gas supply source 41 has a processing gas supply amount control mechanism (not shown) and controls the supply amount of processing gas. In addition, the ceiling electrode plate 36 has a plurality of gas supply holes 42 (gas holes) formed therethrough which allow the internal space 38 to communicate with the upper chamber 11a. The shower head 13 distributes the processing gas, which is introduced from the processing gas introducing pipe 40 into the internal space 38 of the electrode support 37, into the upper chamber 11a through the gas supply holes 42.

In the plasma processing apparatus 10, two multi-pole ring magnets 43a and 43b are disposed above and below the gate valve 19 around the upper chamber 11a, respectively. In each of the multi-pole ring magnets 43a and 43b, a plurality of anisotropic segment columnar magnets (not shown) is accommodated in a ring-like magnetic casing (not shown). In the casing, the plurality of anisotropic segment pillar-like magnets is arranged in such a manner that directions of magnetic poles of adjacent segment columnar magnets are opposite to each other. With such arrangement, magnetic force lines are formed between adjacent segment columnar magnets, a magnetic field is formed around the processing space located between the shower head 13, which serves as the upper electrode, and the lower electrode 20, thereby confining the plasma in the processing space. Alternatively, the plasma processing apparatus may be configured without the multi-pole ring magnets 43*a* and 43*b*.

In the plasma processing apparatus 10, when the wafer W is subjected to RIE or ashing, after the pressure of the processing chamber 11 is adjusted to a desired degree of vacuum, by introducing the processing gas into the upper chamber 11*a* and supplying RF powers from the first RF power supply 30 and the second RF power supply 31 to the upper chamber 11*a*, plasma is generated from the processing gas, and at the same time, ions in the plasma are attracted to the wafer W.

Figure 2:
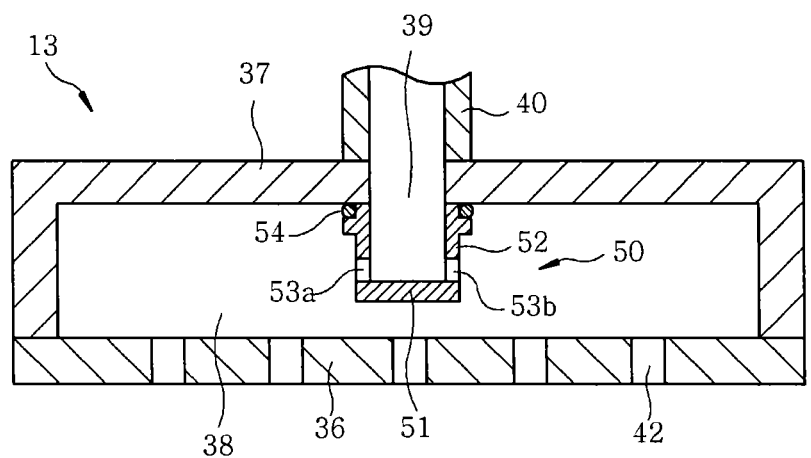
FIG. 2 is a schematic sectional view showing a configuration of a processing gas diffusing and supplying unit shown in FIG. 1.

FIG. 2 is a schematic sectional view showing a configuration of the processing gas diffusing and supplying unit shown in FIG. 1.

Figure 3:
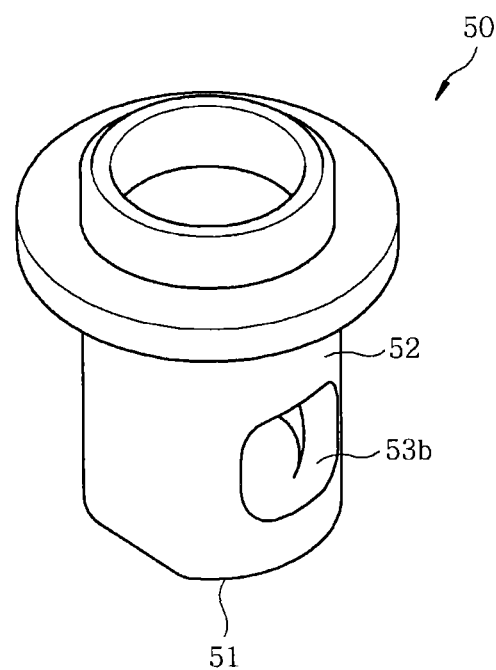
FIG. 3 is a schematic perspective view showing a configuration of the cover part shown in FIG. 1.

In FIG. 2, the cover part 50 includes a bottom portion 51 (shielding portion) which is disposed in the internal space 38 to face and cover the opening 39, and a side wall 52 (supporting portion) for supporting the bottom portion 51 in a predetermined position in the internal space 38, for example, in the center of the internal space 38 in the vertical direction of the figure. The cover part 50 has a hollow cylindrical shape whose one end is opened, as a whole (see FIG. 3). Here, the bottom portion 51 has a disc shape and the side wall 52 is extended perpendicular to the bottom portion 51. In addition, the side wall 52 holds the bottom portion 51 in such a manner that a surface of the bottom portion 51 is made parallel to the surface of the wafer W which is accommodated in the processing chamber 11 and mounted on the mounting table 12. An O-ring 54 is interposed between the opened end of the cover part 50 and the electrode plate support 37 to make a hermetical seal between the cover part 50 and the electrode plate support 37. In addition, through holes 53*a* and 53*b* are formed in the side wall 52 and the processing gas which introduced into the cover part 50 through the opening 39 is introduced into the internal space 38 via the through holes 53*a* and 53*b*.

In the plasma processing apparatus 10, the processing gas introduced into the cover part 50 collides with the bottom portion 51 of the cover part 50. Since the bottom portion 51 faces the opening 39 and a flow of the introduced processing gas is greatly curved by the collision, the introduced processing gas is not directly injected toward a gas supply hole 42 located right below the opening 39. In addition, after colliding with the bottom portion 51, the processing gas flows along the surface of the bottom portion 51 and diffuses into the internal space 38 via the through holes 53*a* and 53*b*. Here, as described above, since the surface of the bottom portion 51 is parallel to the surface of the wafer W mounted on the mounting table 12, the processing gas diffused from the through holes 53*a* and 53*b* is injected substantially perpendicular to the side wall 52 and is diffused in the internal space in substantially parallel to the surface of the wafer W.

Figure 8:
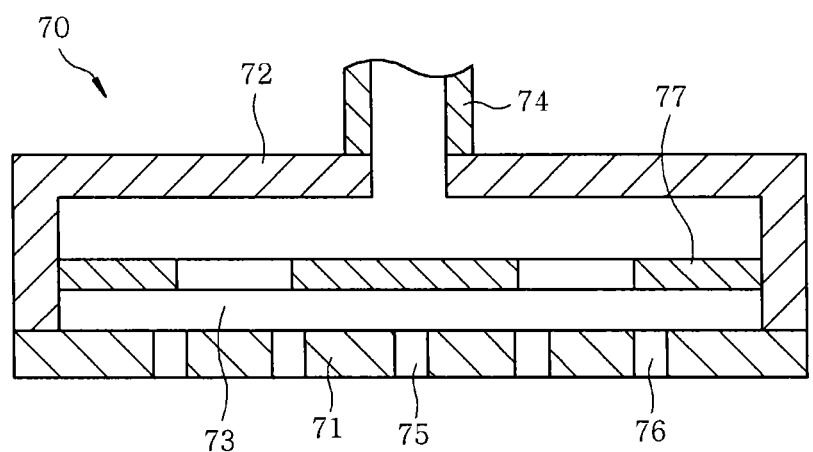
FIG. 8 is a schematic sectional view showing a configuration of a conventional shower head provided with buffer plates.

With the plasma processing apparatus 10 according to this embodiment, there is no need to divide the internal space 38 into an upper space and a lower space (see FIG. 8). As a result, it is possible to secure sufficient height with regard to the diffusion direction of the processing gas and thus increase a conductance with regard to the diffusion direction of the processing gas in the internal space 38. The effect that the greater height of the internal space 38 gives the larger conductance will be described below with reference to FIG. 4.

Figure 4:
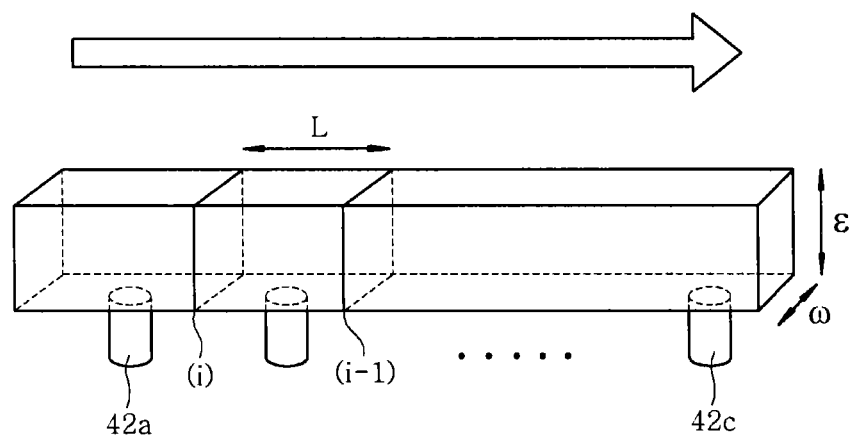
FIG. 4 is a view for explaining a conductance with regard to a gas flow.

FIG. 4 is a view for explaining a conductance with regard to a gas flow direction.

In FIG. 4, a rectangular parallelepipedon represents a space where a gas flows and a white arrow in the figure represents a gas flow direction. In the figure, it is assumed that the height of the space is ∈, the width thereof is ω, and the length of a space defined by a plane (i) and a plane (i−1) is L. Assuming that pressures exerted on the plane (i) and the plane (i−1) are $P_{si}$ and $P_{s(i-1)}$, respectively, and a viscosity coefficient is μ, a conductance with regard to the gas flow direction in the space defined by the plane (i) and the plane (i−1) is expressed by the following Equation 1.

$$C_{si} = \in^3 \omega/12 \ \mu L \cdot (P_{si} + P_{s(i-1)})/2 \qquad \text{Eq. 1}$$

According to Eq. 1, since the conductance $C_{si}$ is in proportion to the cube of the height of the space, it can be seen that the greater height of the space give the larger conductance with regard to the gas flow direction.

In addition, a flow rate $Q_{si}$ of the gas flowing through the space defined by the plane (i) and the plane (i−1) is expressed by the following Equation 2.

$$Q_{si} = C_{si}(P_{si} - P_{s(i-1)}) \qquad \text{Eq. 2}$$

According to Eqs. 1 and 2, since the flow rate of the gas flowing through the space is in proportion to the conductance and the conductance is in proportion to the cube of the height of the space, it can be seen that the flow rate of the gas depends greatly on the height of the space and the greater height gives the larger flow rate.

Here, it is assumed that the space represented by the rectangular parallelepipedon is substituted with the internal space 38 of the plasma processing apparatus 10, with the gas supply holes 42 located in the bottom of the rectangular parallelepipedon (see FIG. 4), with a gas supply hole 42*a*, which is a portion of the gas supply holes 42, located right below the opening 39 and the cover part 50, and with a gas supply hole 42*c* located in the outer peripheral portion of the internal space 38. As described above, since the flow rate with regard to the gas diffusion direction increases when the height of the space is sufficiently secured, the processing gas can sufficiently diffuse up to the internal space 38 apart in the right direction of FIG. 4 (that is, the space right above the gas supply hole 42*c*) from the internal space 38 right below the opening 39 (that is, the space right above the gas supply hole 42*a*). Accordingly, the processing gas can be uniformly supplied into the processing chamber 11 through the gas supply holes 42*a* and 42*c*, thereby securing in-plane uniformity of the plasma process in the wafer W. In addition, the present inventor confirmed that the processing gas can diffuse more effectively when the height of the internal space 38 is equal to or greater than 8 mm.

Figure 5:
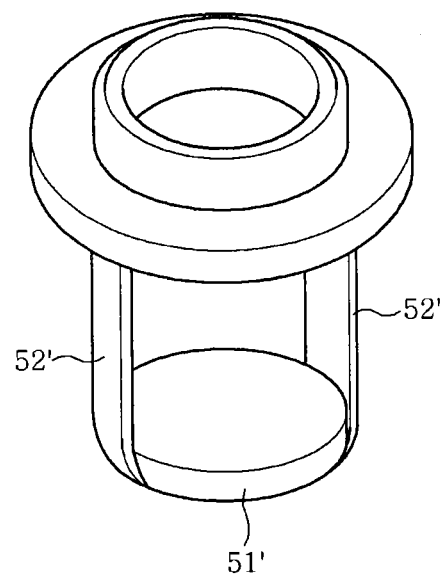
FIG. 5 is a schematic perspective view showing a first modification of the cover part.
Figure 6:
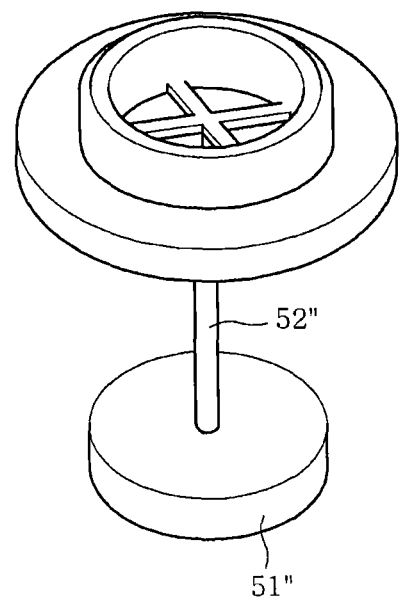
FIG. 6 is a schematic perspective view showing a second modification of the cover part.
Figure 7:
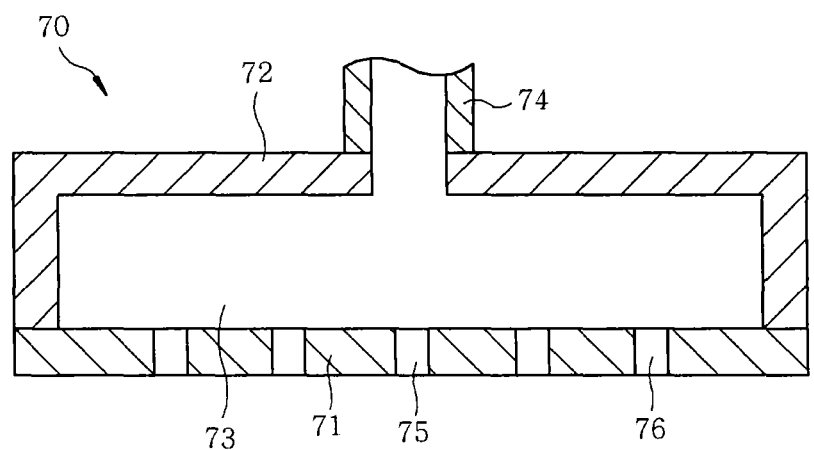
FIG. 7 is a schematic sectional view showing a configuration of a conventional shower head.

Although it has been illustrated in the above-described embodiment that the cover part 50 has the cylindrical shape, the cover part 50 is not limited thereto. For example, the side wall 52 of the cover part 50 may have a plate shape as shown in FIG. 5 or a bar shape as shown in FIG. 6. In addition, the bottom portion 51 may have a surface covering the opening 39 and is not limited to the disc shape.

In addition, the cover part 50 and the shower head 13 may be formed in a single body, which provides no need to increase the number of parts of the shower head, thereby avoiding complexity of processes of manufacturing the shower head 13 and the plasma processing apparatus 10.

EXAMPLES

Next, examples of the present invention will be described.

Inventive Examples 1 and 2

First, the present inventor prepared a wafer Wox having an oxide film formed on its entire surface, loaded the wafer Wox in the processing chamber 11 of the plasma processing apparatus 10 provided with the cover part 50 as shown in FIG. 2, and then subjected the wafer Wox to RIE. After completion of RIE, the thickness of the oxide film throughout the surface of the wafer Wox was measured and then an etching rate and nonuniformity of the etching rate were calculated (Inventive Example 1). In addition, a wafer Wpr having a photoresist film formed on its entire surface was prepared, the wafer Wpr was subjected to the same process as Inventive Example 1, and then an etching rate and nonuniformity of the etching rate were calculated (Inventive Example 2).

Comparative Examples 1 and 2

Next, the present inventor loaded a wafer Wox having an oxide film formed on its entire surface in the processing chamber 11 of the plasma processing apparatus 10 provided with the shower head 70 having the buffer plate 77 (see FIG. 8) instead of the shower head 13, and then subjected the wafer Wox to RIE as in Inventive Example 1. After completion of RIE, the thickness of the oxide film throughout the surface of the wafer Wox was measured and then an etching rate and nonuniformity of the etching rate were calculated (Comparative Example 1). In addition, a wafer Wpr having a photoresist film formed on its entire surface was subjected to the same process as Comparative Example 1, and then an etching rate and nonuniformity of the etching rate were calculated (Comparative Example 2).

Table 1 shows results of the calculation for Inventive Examples 1 and 2 and Comparative Examples 1 and 2.

TABLE 1

|  | Wafer used | Etching rate (nm/min) | Nonuniformity of etching rate (%) |
|---|---|---|---|
| Inventive EX 1 | Wox | 442.4 | 3.0 |
| Inventive EX 2 | Wpr | 89.2 | 65.2 |
| Comparative EX 1 | Wox | 457.8 | 7.6 |
| Comparative EX 2 | Wpr | 106.4 | 75.8 |

It was confirmed from Inventive Examples 1 and 2 and Comparative Example 1 and 2 that the nonuniformity of the etching rate was low (that is, uniformity is high) when any of the wafers Wox and Wpr was subjected to the plasma process using the plasma processing apparatus 10 provided with the cover part 50 instead of the buffer plate. It can be seen from this result that the plasma processing apparatus 10 provided with the cover part 50 can lower nonuniformity of an etching rate of the surface of the wafer W and thus secure in-plane uniformity of the wafer W.

Figure 9:
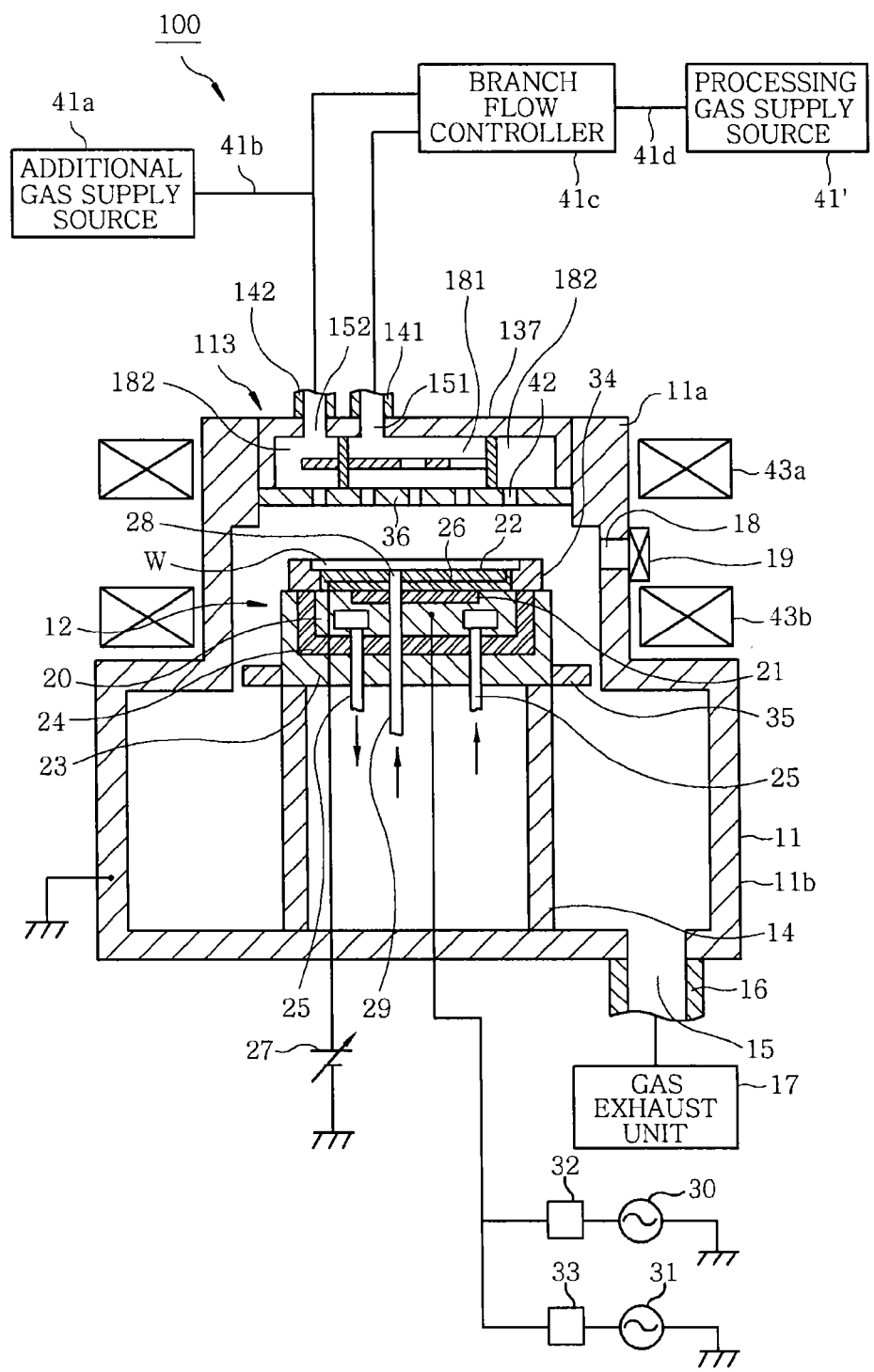
FIG. 9 is a schematic sectional view showing a configuration of a plasma processing apparatus in accordance with another embodiment of the present invention.

FIG. 9 is a schematic sectional view showing a configuration of a plasma processing apparatus in accordance with another embodiment of the present invention. This plasma processing apparatus 100 has the same configuration as that of the plasma processing apparatus shown in FIG. 1 except the configuration of a processing gas diffusing and supplying apparatus 113, a first and a second processing gas introducing pipe 141 and 142 and a processing gas supply source 41'.

Referring to FIG. 9, the processing gas diffusing and supplying unit 113 (shower head) as an upper electrode of the plasma processing apparatus 100 includes an electrode plate 36 (plate) made of a conductive material and an electrode plate support 137 (main body) for supporting the electrode plate. The processing gas diffusing and supplying unit 113 has therein an internal space (gas diffusion chamber/buffer chamber) for diffusing a processing gas. The internal space includes a first internal space 181 (first gas diffusion chamber/buffer chamber) for supplying a processing gas toward the substrate W, and a second internal space 182 (second gas diffusion chamber/buffer chamber) for injecting a processing gas toward the peripheral portion of the substrate W, the second internal space 182 being disposed around the first internal space 181. A first and a second opening 151 and 152 communicating with the first and the second internal space 181 and 182, respectively, are formed at an upper portion of the processing gas diffusing and supplying unit 113. The first and the second processing gas introducing pipe 141 and 142 are connected to the first and the second opening 151 and 152, so that a processing gas from the processing gas supply source 41' is supplied.

The first opening 151 faces the plate 36 (specifically, a part of the gas supply holes 42 in the first space 181) and is disposed at an outer side of the first internal space 181 (central region buffer chamber) of the processing gas diffusing and supplying unit 113. In the same manner, the second opening 152 faces the plate 36 (specifically, a part of a plurality of gas supply holes 42 in the second space 182) and is disposed at an inner side of the second internal space 181 (peripheral region buffer chamber) of the processing gas diffusing and supplying unit 113. The first and the second processing gas introducing pipe 141 and 142 have one ends connected to the first and the second opening 151 and 152 formed at the electrode plate support 167, respectively, and the other ends connected to the processing gas supply source 41'. Further, an additional gas supply source 41a for supplying an additional processing gas is connected to the second processing gas introducing pipe 142 via an additional gas supply pipe 41b. Hence, an additional gas is supplied into the second internal space 182 and introduced into the upper chamber 11a. Accordingly, the amount of the processing gas that is insufficient in the peripheral portion of the substrate W can be supplemented, which enables uniform etching. Here, the configuration of supplying an additional gas into the second space 182 was employed. However, when other spaces, e.g., a third internal space (see FIG. 15), a fourth internal space (see FIG. 16) and the like, are provided, a configuration of connecting additional gas supply lines to the respective processing gas supply lines and supplying additional gases into the respective internal spaces may provide the same effect.

A branch flow controller 41c is connected to the processing gas supply source 41' via a processing gas supply line 41d. The branch flow controller 41c divides a gaseous mixture supplied from the processing gas supply source 41' at a predetermined flow rate ratio and supplies the processing gas to the first and the second processing gas introducing pipe (branch lines) 141 and 142. The branch line controller 41c has a unit for controlling branch flows based on pressures in the first and the second processing gas introducing pipe 141 and 142 or a flow rate control unit (mass flow controller). The processing gas supply source 41' has a processing gas supply amount control unit (not shown) and controls the supply amount of the processing gas supplied to the processing gas supply line 41d. The processing gas is supplied to the first and the second processing gas introducing pipe 141 and 142 at an optimal branch flow ratio, then to the internal space of an optimal height via the shielding portion, and then to the upper chamber 11a. Accordingly, the optimal substrate processing can be carried out. The processing gas diffusing and supplying unit 113 supplies the processing gases that have been introduced into the internal space of the processing gas diffusing and supplying unit 113 from the first and the second processing gas introducing pipe 141 and 142 into the upper chamber 11a below the ceiling electrode plate 36 via a plurality of gas supply holes 42.

Figure 10:
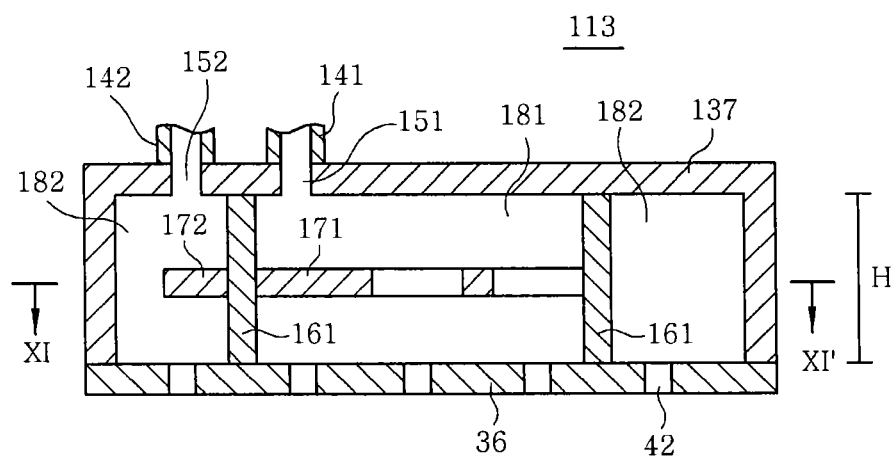
FIG. 10 is a schematic sectional view showing a configuration of a processing gas diffusing and supplying unit shown in FIG. 9.
Figure 11:
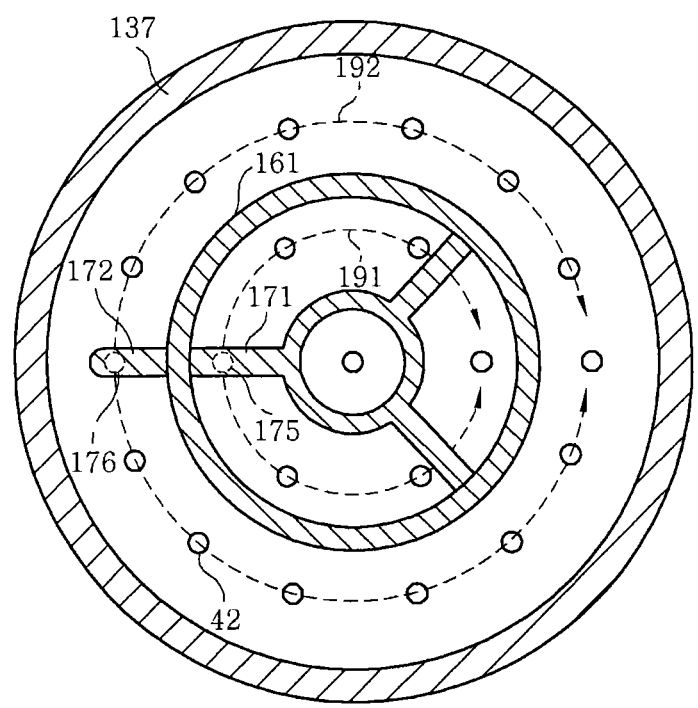
FIG. 11 is a sectional view showing the processing gas diffusing and supplying unit shown in FIG. 9 which is taken along line XI-XI'.
Figure 12:
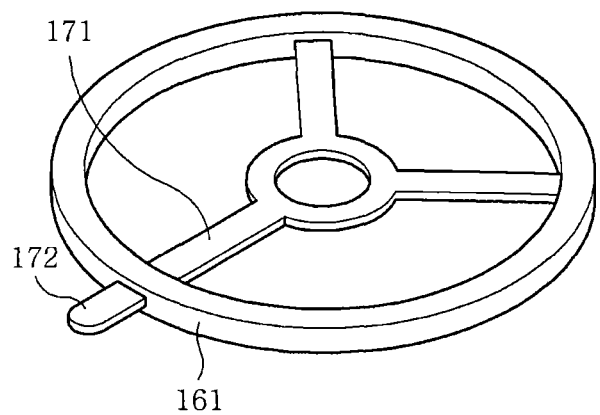
FIG. 12 is a perspective view showing a shielding portion and a partition wall shown in FIG. 10.

FIG. 10 is a schematic sectional view showing a configuration of a processing gas diffusing and supplying unit shown in FIG. 9. FIG. 11 is a sectional view showing the processing gas diffusing and supplying unit shown in FIG. 9 which is taken along line XI-XI'. FIG. 12 is a perspective view showing a shielding portion and a partition wall shown in FIG. 10.

Referring to FIGS. 10 to 12, a first shielding portion 171 having a surface facing the first opening 151 and a second shielding portion 172 having a surface facing the second opening 152 are provided in the internal space of the processing gas diffusing and supplying unit 113. The first shielding portion 171 includes a portion 175 opposite to the first opening 151 right below the first opening 151 (accordingly, the processing gas introduced from the first opening 151 is prevented from being directly injected toward the gas supply holes 42). The second shielding portion 172 includes a portion 176 opposite to the second opening 152 right below the second opening 152 (accordingly, the processing gas introduced from the second opening 152 is prevented from being directly injected toward the gas supply holes 42). The internal space of the processing gas diffusing and supplying unit 113 is divided by the partition wall 161 into the first internal space 181 (i.e., inside the partition wall 161) including the first opening 151 and the first shielding portion 171 and the second internal space 182 (i.e., outside the partition wall 161) including the second opening 152 and the second shielding portion 172. The partition wall 161 is disposed so as not to block the gas supply holes 42 and has a substantially cylindrical shape. The partition wall 161 may have any shape as long as it is disposed between the gas supply holes 42 so as not to block the gas supply holes 42, and preferably has a curved surface shape in order to facilitate the diffusion of the processing gas. The first and the second shielding portion 171 and 172 are supported by the partition wall 161 so as to be in parallel with the ceiling electrode plate 36 and the surface of the wafer W mounted on the mounting table 12 (i.e., in parallel with the surface of the mounting table 12 for mounting thereon the wafer W). The first and the second shielding portion 171 and 172 are perpendicular to the partition wall 161.

The first and the second shielding portion 171 and 172 may be formed as one unit with the partition wall 161. In that case, the number of components of the processing gas diffusing and supply unit 113 may be decreased. Accordingly, the manufacturing process of the processing gas diffusing and supply unit 113 and the plasma processing apparatus 100 does not become complicated. Further, it is preferable that the width of the first and the second shielding portion 171 and 172 is equal to or larger than the diameter of the gas supply holes 42.

Hence, the processing gas that has been introduced into the first internal space 181 through the first opening 151 collides with the first shielding portion 171. As a consequence, the flow of the introduced processing gas is bent in a horizontal direction by the collision. Therefore, the introduced processing gas is not directly injected toward the gas supply holes 42 right below the first opening 151. Further, the processing gas colliding with the first shielding portion 171 is diffused substantially in parallel with the surface of the wafer W in the first internal space 181. Particularly, since the partition wall 161 has substantially a cylindrical shape, the processing gas is diffused in, e.g., a diffusion direction 191 of the processing gas, along the partition wall 161 and uniformly diffused into the first internal space 181.

In the same manner, the processing gas that has been introduced into the second internal space 182 through the second opening 152 collides with the second shielding portion 172. As a consequence, the flow of the introduced processing gas is bent in a horizontal direction by the collision. Therefore, the introduced processing gas is not directly injected toward the gas supply holes 42 right below the second opening 152. Further, the processing gas colliding with the second shielding portion 172 is diffused substantially in parallel with the surface of the wafer W in the second internal space 182. Particularly, since the partition wall 161 and the sidewall of the electrode plate support 137 have substantially a cylindrical shape, the processing gas is diffused in, e.g., a diffusion direction 192 of the processing gas, along the partition wall 161 and the sidewall of the electrode plate support 137.

In accordance with the plasma processing apparatus 100 of the present embodiment, it is unnecessary to divide the first and the second internal space 181 and 182 into an upper space and a lower space (see FIG. 8). Moreover, the processing gas whose flow direction is changed by the first and the second shielding portion 171 and 172 may be diffused without passing through a gas flow conductance modulator (e.g., a baffle plate 14 of US2004/0129217 or the buffer plate 77 of FIG. 8) in the first and the second internal space 181 and 182. As a result, in the first and the second internal space 181 and 182, it is possible to secure sufficient height with regard to the diffusion directions 191 and 192 of the processing gas and thus increase a conductance with regard to the diffusion directions of the processing gas. The effect that the greater height of the internal space 38 gives the larger conductance has been described with reference to FIG. 4.

In accordance with the plasma processing apparatus 100 of the present embodiment, near apposition corresponding to the peripheral portion of the substrate, the internal space of the processing gas diffusing and supplying unit 113 is divided by the partition wall 161 into the first internal space 181 located at a relatively inner portion and the second internal space 182 located at a relatively outer portion. Therefore, even if the positions of the first and the second opening 151 and 152 are offcentered, the processing gas is shielded by the first and the second shielding portion 171 and 172 so as not to be directly injected to the gas supply holes. Accordingly, the processing gas in the first and the second internal space 181 and 182 can be uniformly diffused and supplied into the upper chamber 11a, which results in improvement of the uniformity of the etching rate. Particularly, when the height H of the first and the second internal space 181 and 182 is set to about 8 mm or above, it is possible to secure sufficient height with regard to the diffusion directions 191 and 192 of the processing gas. Hence, the processing gas injected from a plurality of gas supply holes 42 can be uniformly diffused, and the uniformity of the etching rate can be improved.

Figure 13:
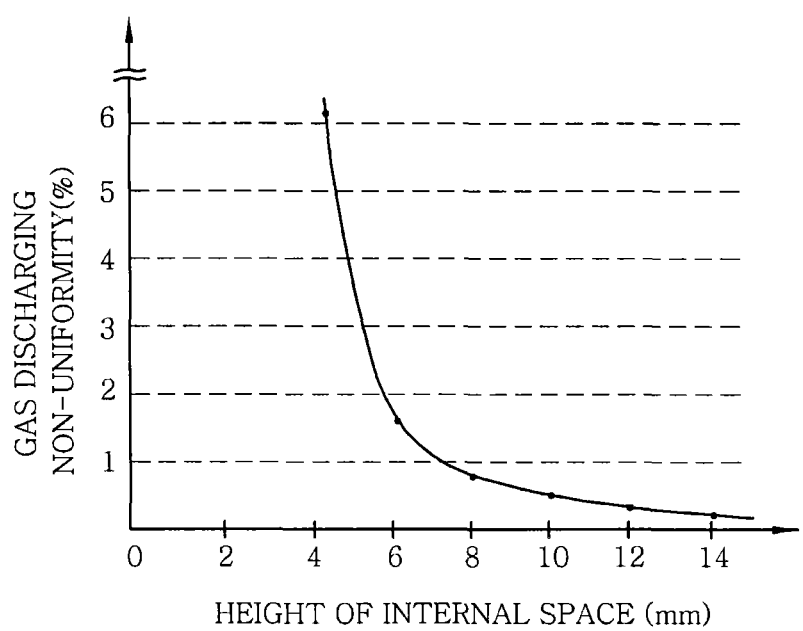
FIG. 13 is a graph showing non-uniformity of gas injection in accordance with a height of an internal space of the processing gas diffusing and supplying unit shown in FIG. 10.
Figure 14:
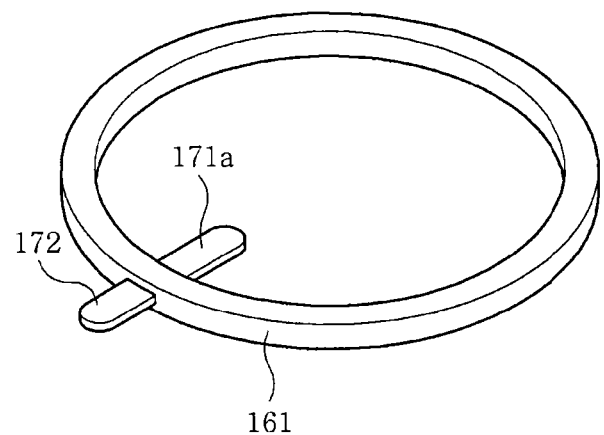
FIG. 14 shows a modification of the shielding portion and the partition wall shown in FIG. 10.

FIG. 13 is a graph showing non-uniformity of gas injection in accordance with the height of the internal space of the processing gas diffusing and supplying unit shown in FIG. 10. Referring to FIG. 13, as the height of the internal space of the processing gas diffusing and supplying unit 113 including the first and the second shielding portion 171 and 172 and the partition wall 181 is increased, the non-uniformity of the processing gas injected into the processing chamber 11 through the gas supply holes 42 of the ceiling electrode plate 36 is decreased. Particularly, when the height of the internal space of the processing gas diffusing and supplying unit 113 is about 8 mm or above, the diffusion in the internal space is made uniform. Therefore, the non-uniformity of the gas injection becomes smaller than about 1%, and the processing gas can be considerably uniformly supplied into the processing chamber 11. Preferably, the height of the internal space is about 8 mm to 20 mm. More preferably, the height of the internal space is about 10 mm to 20 mm FIG. 14 shows an example of the shielding portion and the partition wall shown in FIG. 10. Unlike the first shielding portion 71 shown in FIG. 10 which is supported by three portions of the partition wall 161, the first shielding portion 171a shown in FIG. 14 is supported by a single portion of the partition wall 161 as in the case of the second shielding portion 172 and has a similar shape to that of the second shielding portion 172. Accordingly, in the case of employing the first shielding portion 171a shown in FIG. 14, the conductance of the diffusion direction of the processing gas in the first internal space 181 can be further increased compared to the case of employing the first shielding portion shown in FIG. 10.

The shape of the shielding portions 171, 171a and 172 of the above-described present invention is not limited to the above, and may also be a plate shape, a circular plate shape or the like which can change the flow of the processing gas in a horizontal direction.

Figure 15:
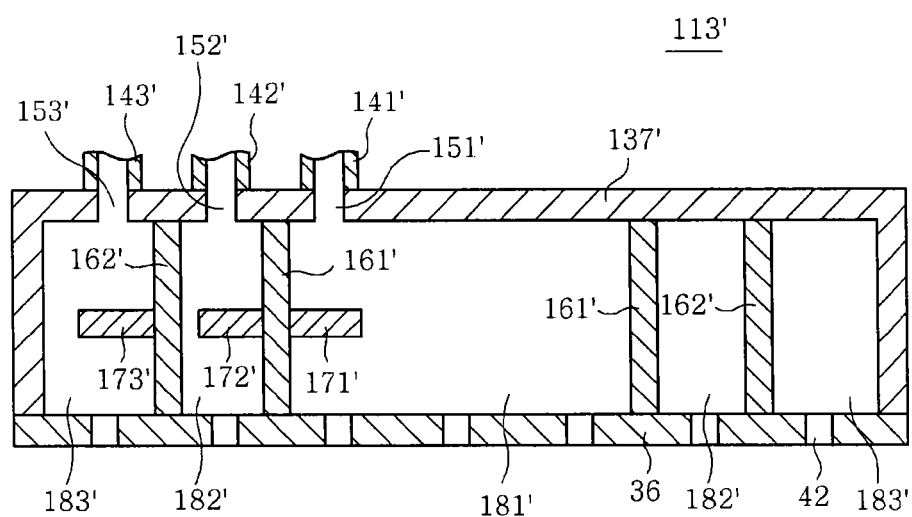
FIG. 15 is a schematic sectional view showing a configuration of a processing gas diffusing and supplying unit in accordance with still another embodiment of the present invention.

FIG. 15 is a schematic sectional view showing a configuration of a processing gas diffusing and supplying unit in accordance with still another embodiment of the present invention.

Referring to FIG. 15, a processing gas diffusing and supplying unit 113' has a configuration in which a third internal space 183' partitioned by a second partition wall 162' is formed at an outside of the second internal space 182 shown in FIG. 10. In the processing gas diffusing and supplying unit 113', an internal space of an electrode support 137' for supporting the ceiling electrode plate 36 having the gas supply holes 42 is partitioned by the partition walls 161' and 162' into the first to the third internal space 181' to 183'. In the first to the third internal space 181' to 183', first to third opening 151 to 153' communicating with the respective spaces 181' to 183' are formed, and the first to the third gas supply lines 141' to 143' are connected to the openings 151' to 153', respectively. In each of the spaces 181' to 183', first to third shielding portion 171' to 173' are disposed so as to face the respective openings 151' to 153' in order to prevent the processing gas supplied from the respective openings 151' to 153' from being directly injected to the gas supply holes 42. Therefore, by employing the configuration in which the third internal space 183' is added to the configuration of FIG. 10, the processing gas is more uniformly diffused without bias in the respective spaces 181' to 183' of the processing gas diffusing and supplying unit 113' compared to the configuration of FIG. 10. Accordingly, the processing gas is more uniformly supplied to the entire area of the substrate W, and the uniformity of the etching rate in the entire area of the substrate W is further improved.

Figure 16:
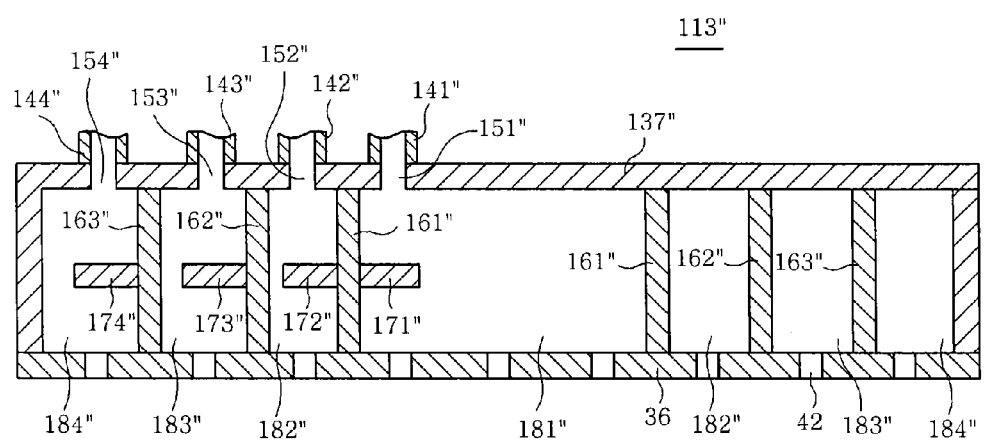
FIG. 16 is a schematic sectional view showing a configuration of a processing gas diffusing and supplying unit in accordance with still another embodiment of the present invention.

FIG. 16 is a schematic sectional view showing a configuration of a processing gas diffusing and supplying unit in accordance with still another embodiment of the present invention.

Referring to FIG. 16, a processing gas diffusing and supplying unit 113" has a configuration in which a fourth internal space 184" partitioned by a third partition wall 163" is formed at an outside of the third internal space 183' shown in FIG. 15. In the processing gas diffusing and supplying unit 113", the internal space of the electrode support 137" for supporting the ceiling electrode plate 36 having the gas supply holes 42 is partitioned by the first to the third partition wall 161" to 163" into the first to the fourth internal space 181" to 184". In the first to the fourth internal space 181" to 184", first to fourth opening 151" to 154" communicating with the respective spaces 181" to 184" are formed, and first to the fourth gas supply lines 141" to 144" are connected to the openings 151" to 154", respectively. In the spaces 181" to 184", first to fourth shielding portion 171' to 174" are disposed so as to face the respective openings 151" to 154" in order to prevent the processing gas supplied from the respective openings 151" to 154" from being directly injected to the gas supply holes 42. Therefore, by employing the configuration in which the fourth internal space 184" is added to the configuration of FIG. 15, the processing gas is more uniformly diffused without bias in the respective spaces 181" to 184" of the processing gas diffusing and supplying unit 113" compared to the configuration of FIG. 15. Accordingly, the processing gas is more uniformly supplied to the entire area of the substrate W, and the uniformity of the etching rate in the entire area of the substrate W is further improved.

While the invention has been shown and described with respect to the embodiments, it will be understood by those skilled in the art that various changes and modification may be made without departing from the scope of the invention as defined in the following claims.

What is claimed is:

1. A processing gas diffusing and supplying unit, provided in a substrate processing unit including a processing chamber for accommodating a substrate and a first and a second processing gas introducing pipe, for supplying a processing gas into the processing chamber, the processing gas diffusing and supplying unit comprising:
    a main body;
    a plate supported by the main body, the plate having a plurality of gas supply holes for supplying the processing gas into the processing chamber;
    a partition wall;
    an internal space formed in the main body, the internal space having a first and a second space partitioned by the partition wall and the processing gas being supplied through the first and the second processing gas introducing pipe to the internal space;
    a first opening communicating with the first space while facing the plate, the first opening being connected to the first processing gas introducing pipe;
    a second opening communicating with the second space while facing the plate, the second opening being connected to the second processing gas introducing pipe;
    a first shielding portion installed in the first space, the first shielding portion having a surface opposite to the first opening; and a second shielding portion installed in the second space, the second shielding portion having a surface opposite to the second opening, wherein a height of the internal space is equal to or greater than 8 mm so that the processing gas discharged from the first and the second opening is diffused to the first and the second space and is uniformly supplied through the gas supply holes, wherein the first shielding portion and the second shielding portion are strip elements extending more in a radial direction than a lateral direction, and wherein the second shielding portion is supported only by the partition wall.

2. The processing gas diffusing and supplying unit of claim 1, wherein the first opening is disposed at a location closer to a center of the processing gas diffusing and supplying unit compared to the second opening.

3. The processing gas diffusing and supplying unit of claim 1, wherein the first opening and the second opening are disposed at locations separated from a center of the processing gas diffusing and supplying unit; and wherein the surface opposite to the first opening and the surface opposite to the second opening are in parallel with a surface of the substrate accommodated in the processing chamber.

4. The processing gas diffusing and supplying unit of claim 1, wherein the first shielding portion is supported only by the partition wall.

5. The processing gas diffusing and supplying unit of claim 4, wherein the substrate processing apparatus further includes a third processing gas introducing pipe, and the processing gas diffusing and supplying unit further comprises:

another partition wall configured to define a third space by partitioning the internal space;

a third opening communicating with the third space while facing the plate, the third opening being connected to the third processing gas introducing pipe;

a third shielding portion installed in the third space, the third shielding portion having a surface facing the third opening, and wherein the third shielding portion is supported only by said another partition wall.

6. The processing gas diffusing and supplying unit of claim 5, wherein the substrate processing apparatus further includes a fourth processing gas introducing pipe, and the processing gas diffusing and supplying unit further comprises:

still another partition wall configured to define a fourth space by partitioning the internal space;

a fourth opening communicating with the fourth space while facing the plate, the fourth opening being connected to the fourth processing gas introducing pipe;

a fourth shielding portion installed in the fourth space, the fourth shielding portion having a surface facing the fourth opening, and wherein the fourth shielding portion is supported only by said still another partition wall.

7. The processing gas diffusing and supplying unit of claim 1, wherein the partition wall is disposed between the gas supply holes so as not to block the gas supply holes.

8. The processing gas diffusing and supplying unit of claim 1, wherein the first shielding portion and the second shielding portion are formed as one unit with the partition wall.

9. A substrate processing apparatus comprising:

a processing chamber configured to accommodate a substrate;

a processing gas diffusing and supplying unit configured to supply a processing gas into the processing chamber; and a first and a second processing gas introducing pipe configured to introduce the processing gas into the processing gas diffusing and supplying unit, wherein the processing gas diffusing and supplying unit includes:

a main body;

a plate supported by the main body, the plate having a plurality of gas supply holes for supplying the processing gas into the processing chamber;

a partition wall;

an internal space formed in the main body, the internal space having a first and a second space partitioned by the partition wall and the processing gas being supplied through the first and the second processing gas introducing pipe to the internal space;

a first opening communicating with the first space while facing the plate, the first opening being connected to the first processing gas introducing pipe;

a second opening communicating with the second space while facing the plate, the second opening being connected to the second processing gas introducing pipe;

a first shielding portion installed in the first space, the first shielding portion having a surface opposite to the first opening; and a second shielding portion installed in the second space, the second shielding portion having a surface opposite to the second opening, wherein a height of the internal space is equal to or greater than 8 mm so that the processing gas discharged from the first and the second opening is diffused to the first and the second space and is uniformly supplied through the gas supply holes, wherein the first shielding portion and the second shielding portion are strip elements extending more in a radial direction than a lateral direction, and wherein the second shielding portion is supported only by the partition wall.

10. The substrate processing apparatus of claim 9, wherein the first opening is disposed at a location closer to a center of the processing gas diffusing and supplying unit compared to the second opening.

11. The substrate processing apparatus of claim 9, wherein the first opening and the second opening are disposed at locations separated from a center of the processing gas diffusing and supplying unit; and wherein the surface facing the first opening and the surface facing the second opening are in parallel with a surface of the substrate accommodated in the processing chamber.

12. The substrate processing apparatus of claim 9, wherein the first shielding portion is supported by only the partition wall.

13. The substrate processing apparatus of claim 12, further comprising a third processing gas introducing pipe, wherein the processing gas diffusing and supplying unit further includes: another partition wall configured to define a third space by partitioning the internal space;

a third opening communicating with the third space while facing the plate, the third opening being connected to the third processing gas introducing pipe;

a third shielding portion installed in the third space, the third shielding portion having a surface facing the third opening, and wherein the third shielding portion is supported only by said another partition wall.

14. The substrate processing apparatus of claim 13, further comprising an additional gas supply source connected to at least one of the first to the third processing gas introducing pipe via an additional gas supply pipe.

15. The substrate processing apparatus of claim 13, further comprising a fourth processing gas introducing pipe, wherein the processing gas diffusing and supplying unit further includes:

still another partition wall configured to define a fourth space by partitioning the internal space;

a fourth opening communicating with the fourth space while facing the plate, the fourth opening being connected to the fourth processing gas introducing pipe;

a fourth shielding portion installed in the fourth space, the fourth shielding portion having a surface facing the fourth opening, and wherein the fourth shielding portion is supported only by said still another partition wall.

16. The substrate processing apparatus of claim 15, further comprising an additional gas supply source connected to at least one of the first to the fourth processing gas introducing pipe via an additional gas supply pipe.

17. The substrate processing apparatus of claim 9, wherein the first shielding portion and the second shielding portion are formed as one unit with the partition wall.

18. The substrate processing apparatus of claim 9, wherein a flow of the processing gas introduced into the processing gas diffusing and supplying unit through the first processing gas introducing pipe and a flow of the processing gas introduced into the processing gas diffusing and supplying unit through the second processing gas line are individually controlled.

19. The substrate processing apparatus of claim 9, wherein the partition wall is disposed between the gas supply holes so as not to block the gas supply holes.

20. The substrate processing apparatus of claim 9, further comprising an additional gas supply source connected to at least one of the first and the second processing gas introducing pipe via an additional gas supply pipe.

* * * * *